(12) United States Patent
Lee et al.

(10) Patent No.: US 8,350,369 B2
(45) Date of Patent: Jan. 8, 2013

(54) HIGH POWER SEMICONDUCTOR PACKAGE

(75) Inventors: Keun-hyuk Lee, Bucheon-si (KR);
 Seung-won Lim, Bucheon-si (KR);
 Sung-min Park, Bucheon-si (KR);
 Taek-keun Lee, Bucheon-si (KR)

(73) Assignee: Fairchild Korea Semiconductor, Ltd., Bucheon-si (KR)

( * ) Notice: Subject to any disclaimer, the term of this patent is extended or adjusted under 35 U.S.C. 154(b) by 61 days.

(21) Appl. No.: 11/969,410

(22) Filed: Jan. 4, 2008

(65) Prior Publication Data

US 2008/0164588 A1 Jul. 10, 2008

(30) Foreign Application Priority Data

Jan. 5, 2007 (KR) .................... 10-2007-0001666

(51) Int. Cl.
 *H01L 23/495* (2006.01)

(52) U.S. Cl. ............... 257/676; 779/772; 779/668

(58) Field of Classification Search ............. 257/668, 257/772, 779, E23.015, E23.02, E23.023–E23.079, 257/E21.505
 See application file for complete search history.

(56) References Cited

U.S. PATENT DOCUMENTS

| | | | | |
|---|---|---|---|---|
| 5,124,884 A * | 6/1992 | Yazu et al. | ............. | 361/705 |
| 5,471,089 A | 11/1995 | Nagatomo et al. | | |
| 5,513,072 A | 4/1996 | Imaji et al. | | |
| 5,519,252 A | 5/1996 | Soyano et al. | | |
| 5,521,437 A | 5/1996 | Oshima et al. | | |
| 5,592,735 A * | 1/1997 | Ozawa et al. | .................. | 29/842 |
| 6,002,166 A | 12/1999 | Noda et al. | | |
| 6,083,766 A * | 7/2000 | Chen | ............. | 438/15 |
| 6,159,770 A * | 12/2000 | Tetaka et al. | ................. | 438/112 |
| 6,365,980 B1 * | 4/2002 | Carter et al. | ................. | 257/787 |
| 6,400,004 B1 * | 6/2002 | Fan et al. | ............. | 257/666 |
| 6,448,507 B1 * | 9/2002 | Fontecha et al. | .............. | 174/260 |
| 6,528,877 B2 * | 3/2003 | Ernst et al. | ................ | 257/707 |
| 6,724,075 B2 * | 4/2004 | Lee et al. | ............. | 257/678 |
| 7,034,382 B2 * | 4/2006 | Palmteer et al. | ............. | 257/676 |
| 7,279,780 B2 * | 10/2007 | Fee et al. | ............. | 257/672 |
| 7,436,070 B2 * | 10/2008 | Uno et al. | ................ | 257/777 |
| 7,589,404 B2 * | 9/2009 | Itou et al. | .................. | 257/676 |
| 7,622,332 B2 * | 11/2009 | Islam et al. | ................ | 438/123 |
| 7,777,310 B2 * | 8/2010 | Punzalan et al. | .............. | 257/676 |
| 7,790,500 B2 * | 9/2010 | Ramos et al. | ................ | 438/106 |
| 7,808,085 B2 * | 10/2010 | Ozaki et al. | .................. | 257/667 |
| 7,939,933 B2 * | 5/2011 | Itou et al. | ................ | 257/696 |
| 2001/0007780 A1 * | 7/2001 | Minamio et al. | .............. | 438/106 |
| 2002/0109152 A1 * | 8/2002 | Kobayashi et al. | ........... | 257/177 |
| 2002/0145180 A1 * | 10/2002 | Terui et al. | ................ | 257/666 |
| 2006/0006510 A1 * | 1/2006 | Koduri | ................ | 257/678 |
| 2006/0255438 A1 * | 11/2006 | Omori et al. | ................ | 257/670 |
| 2007/0196950 A1 * | 8/2007 | Shirai et al. | .................. | 438/106 |

\* cited by examiner

*Primary Examiner* — Marcos D. Pizarro
*Assistant Examiner* — Bilkis Jahan
(74) *Attorney, Agent, or Firm* — Hiscock & Barclay, LLP (57) ABSTRACT

Provided is a high power semiconductor package including: an insulation substrate having first and second surfaces opposite to each other; an interconnection patterns formed on the first surface of the insulation substrate, the interconnection patterns including a plurality of first dimples; a power control semiconductor chip mounted on the first surface of the insulation substrate, the power control semiconductor chip electrically connected with the interconnection patterns; and an encapsulation member encapsulating the insulation substrate, the interconnection patterns, and the power control semiconductor chip and exposing at least a portion of the second surface of the insulation substrate.

43 Claims, 5 Drawing Sheets

HIGH POWER SEMICONDUCTOR PACKAGE

CROSS-REFERENCE TO RELATED PATENT APPLICATION

This application claims the benefit of Korean Patent Application No. 10-2007-0001666, filed on Jan. 5, 2007, in the Korean Intellectual Property Office, the disclosure of which is incorporated herein in its entirety by reference.

BACKGROUND OF THE INVENTION

1. Field of the Invention

The present invention relates to a high power semiconductor package, and more particularly, to a high power semiconductor package including a power control semiconductor chip mounted on an insulation substrate.

2. Description of the Related Art

Power devices, such as a silicon-controlled rectifier (SCR), a power transistor, an insulated-gate bipolar transistor (IGBT) a metal oxide semiconductor (MOS) transistor, a power rectifier, a power regulator, an inverter, a converter, and a power control semiconductor chip including a combination thereof, are designed to operate in a high-voltage range from 30 V to 1000 V or higher.

An insulation substrate is used to form the conventional high power semiconductor package. Interconnection patterns are formed on a top surface of the insulation substrate. Power control semiconductor chips may be mounted on some of the interconnection patterns. Bonding pads on top surfaces of the power control semiconductor chips may be electrically connected with the other of interconnection patterns by wires. After a wire bonding process, the conductive patterns are connected to external terminals of the high power semiconductor package such as leads. Thereafter, the high power semiconductor package is encapsulated using an epoxy molding compound (EMC) though a transfer molding process.

A high power semiconductor package manufactured as described above heats to a high temperature when operating, and thus, the electrical and mechanical reliability of the high power semiconductor package can be deteriorated due to repetition of temperature cycles. As a result, the lifespan of the high power semiconductor package may be short relative to that of low power devices, such as DRAM, CPU and Logic devices, etc.

SUMMARY OF THE INVENTION

Our inventors identified the cause of the poor thermal and mechanical reliability as shear stress which may result from a difference in thermal expansion coefficients of an insulating substrate and a metallic interconnection pattern. The difference in the thermal expansion between the epoxy molding compound (EMC) and the interconnection pattern can also cause a shear stress on the interconnection pattern. Such shear stresses can result in the delamination of the interconnection pattern from the insulating substrate, thereby deteriorating the electrical and mechanical characteristics of the high power semiconductor package and reducing the lifespan thereof.

The present invention provides a high power semiconductor package that is designed to improve thermal resistance of the high power semiconductor to increase its lifespan.

According to an aspect of the present invention, there is provided a high power semiconductor package including: an insulation substrate having first and second surfaces opposite to each other; an interconnection patterns formed on the first surface of the insulation substrate, the interconnection patterns including a plurality of first dimples; a power control semiconductor chip mounted on the first surface of the insulation substrate, the power control semiconductor chip electrically connected with the interconnection patterns; and an encapsulation member encapsulating the insulation substrate, the interconnection patterns, and the power control semiconductor chip and exposing at least a portion of the second surface of the insulation substrate.

In some embodiments of the present invention, the insulation substrate may be a ceramic substrate. In other embodiments of the present invention, the insulation substrate may be formed of a metal nitride. The insulation substrate can be a direct bonded copper (DBC) substrate by forming the interconnection patterns using copper or a copper alloy.

The first dimples may have a diameter in a range from 0.1 mm to 3 mm. The first dimples may range in depth from 10% to 100% of a thickness of the interconnection patterns. The first dimples may be formed in an edge of the interconnection patterns so as to reduce shear stress concentrated at the edge of the interconnection patterns.

The first dimples may be arranged at regular intervals in at least one row. The first dimples may be formed in the interconnection patterns located on the edge portion of the insulation substrate more densely than in the interconnection patterns located on the center portion of the insulation substrate, so as to reduce the possibility of permeation of moisture.

According to another aspect of the present invention, there is provided a high power semiconductor package including: an insulation substrate having first and second surfaces opposite to each other, an interconnection patterns formed on the first surface of the insulation substrate, the interconnection patterns including a plurality of first dimples; a power control semiconductor chip mounted on the first surface of the insulation substrate, the power control semiconductor chip electrically connected with the interconnection patterns; a base metal layer formed on the second surface of the insulation substrate; and an encapsulation member encapsulating the insulation substrate, the interconnection patterns, and the power control semiconductor chip and exposing at least a portion of the second surface of the insulation substrate. The base metal layer may be formed of aluminum, an aluminum alloy, copper, or a copper alloy.

The high power semiconductor package may further include a plurality of second dimples formed in an edge portion of the bottom surface of the base metal layer. The second dimples may reduce the volume of the edge of the bottom surface of the base metal layer. Therefore, the edge of the bottom surface of the base metal layer can be less deformed when the base metal layer expands by heat, and thus a shear stress caused by a difference in thermal expansion between the base metal layer and the insulation substrate can be reduced.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

The invention may, however, be embodied in many different forms and should not be construed as being limited to the embodiments set forth herein; rather, these embodiments are provided so that this disclosure will be thorough and complete, and will fully convey the concept of the invention to those skilled in the art. It will also be understood that when a layer is referred to as being "on" another layer or substrate, it can be directly on the other layer or substrate, or intervening layers may also be present. In the drawings, the thicknesses of layers and regions are exaggerated for clarity, and like reference numerals denote like elements. As used herein, the term "and/or" includes any and all combinations of one or more of the associated listed items.

Also, though terms like a first and a second are used to describe various members, components, regions, layers, and/or portions in various embodiments of the present invention, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment can be referred to as a second member, a second component, a second region, a second layer, or a second portion in another embodiment.

Figure 1A:
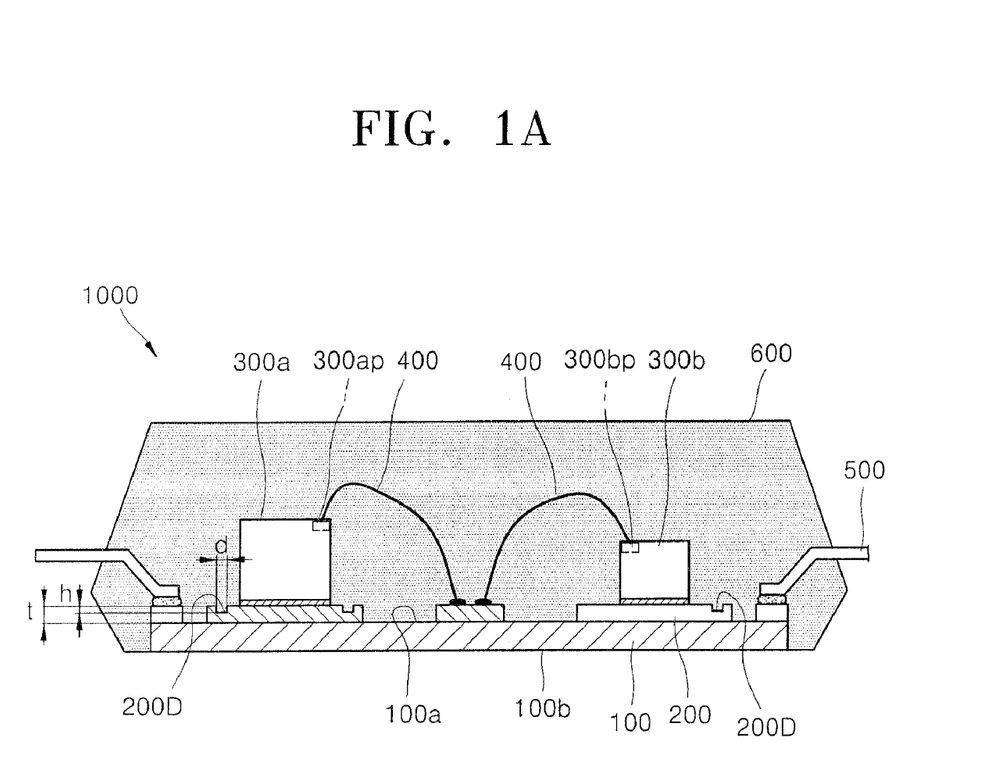
FIG. 1A is a cross-sectional view illustrating a high power semiconductor package according to an embodiment of the present invention.
Figure 1B:
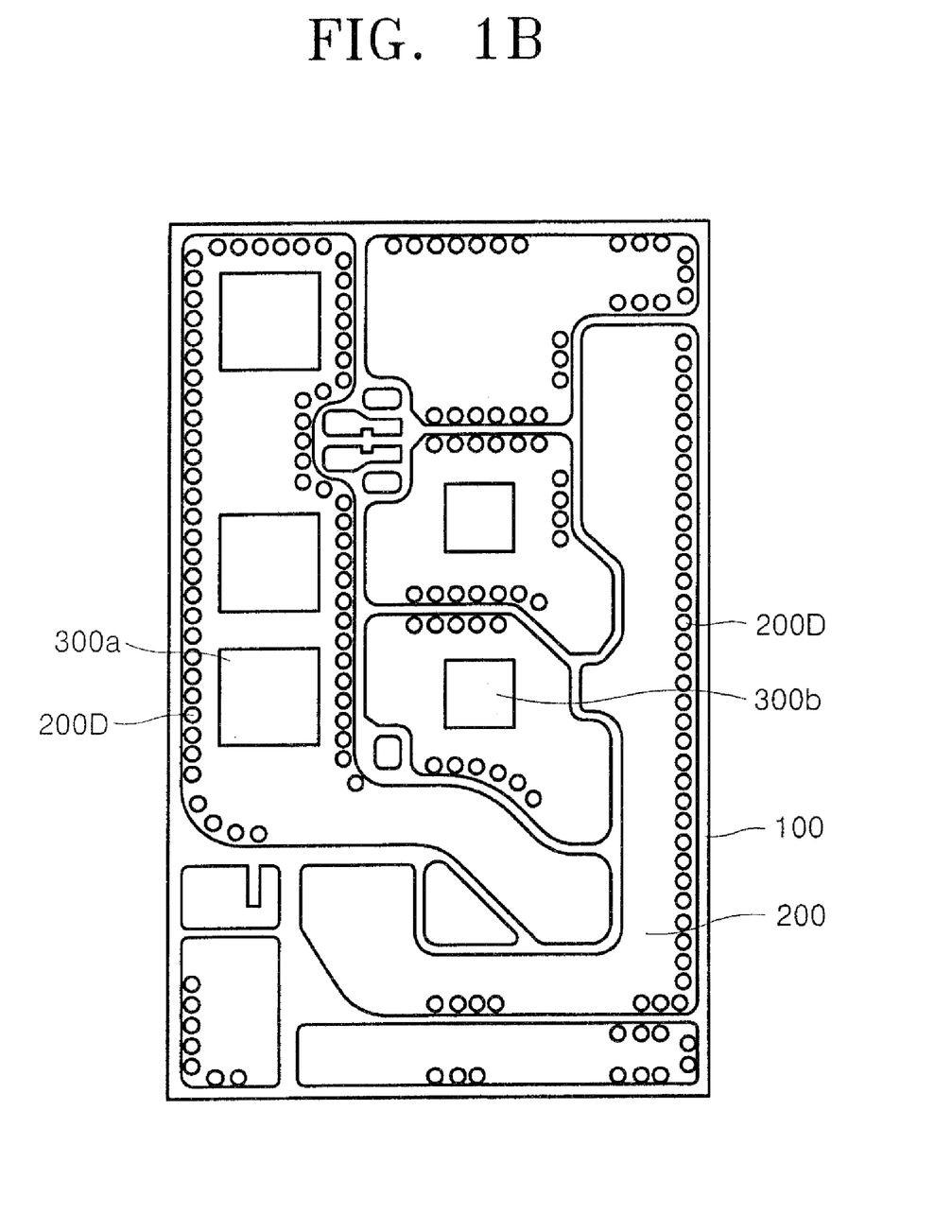
FIG. 1B is a top plan view illustrating interconnection patterns of the high semiconductor package of FIG. 1A, according to an embodiment of the present invention.

FIG. 1A is a cross-sectional view illustrating a high power semiconductor package 1000 according to an embodiment of the present invention, and FIG. 1B is a top plan view illustrating interconnection patterns 200 of the high semiconductor package 1000 of FIG. 1A, according to an embodiment of the present invention.

Referring to FIGS. 1A and 1B, the high power semiconductor package 1000 includes an insulation substrate 100 having first and second surfaces 100a and 100b opposite to each other. The insulation substrate 100 may be formed from a metal nitride or a ceramic material. For example, the metal nitride may be AlN or SiN, and the ceramic material may be $Al_2O_3$ or BeO.

The first surface 100a of the insulation substrate 100 is an insulation surface facing the interior of the high power semiconductor package 1000. The interconnection patterns 200 are formed on the first surface 100a of the insulation substrate 100. The interconnection patterns 200 may have a thickness (t) of 100 μm to 500 μm and be formed from aluminum or an aluminum alloy. When the insulation substrate is formed from a ceramic material, the interconnection patterns 200 can be formed from copper or copper alloy to form a direct bonded copper (DBC) substrate. In this case, a nickel layer (not shown) and/or a gold layer (not shown) can be plated on the copper interconnection patterns 200 to prevent oxidation of the copper interconnection patterns 200.

At least one of interconnection patterns 200 includes a plurality of first dimples 200D. Generally, since a shear stress causing delamination of the interconnection patterns 200 can be concentrated at edges of the interconnection patterns 200, the first dimples 200D may be provided at the edges of the interconnection patterns 200. The first dimples 200D can be formed by forming an etch mask having a corresponding pattern on the interconnection patterns 200 and wet-etching the interconnection patterns 200 using the etch mask. The first dimples 200D can have a maximum diameter (d) in the range from 0.1 mm to 3 mm and a depth (h) in the range from 10% to 100% of the thickness (t) of the interconnection patterns 200. Furthermore, the first dimples 200D can be arranged at regular intervals in rows as illustrated in FIG. 1B. But, the present invention need not to be restricted to the illustrated configuration and the first dimples 200D may be alternately arranged in 2 or more rows.

The first dimples 200D may reduce the volume of the interconnection patterns 200. Therefore, deformation of the interconnection patterns 200 can be reduced when the interconnection patterns 200 expands by heat, thereby reducing a shear stress acting on the interface between the interconnection patterns 200 and the insulation substrate 100 due to a difference in thermal expansion coefficients between the interconnection patterns 200 and the insulation substrate 100. In addition, a shear stress caused by a difference in thermal expansion coefficients between the interconnection patterns 200 and an encapsulation member 600 can be reduced.

The power control semiconductor chip 300a may be mounted on the first surface 100a of the insulation substrate 100 in electric connection with the interconnection patterns 200. A bottom surface of the power control semiconductor chip 300a can be bonded to the interconnection patterns 200 by, for example, soldering or an adhesive such as a conductive epoxy, in order to provide a drain electrode or a ground electrode to the power control semiconductor chip 300a. An integrated circuit (IC) chip such as the low power semiconductor chip 300b may be provided on the insulation substrate 100 to control the power control semiconductor chip 300a to provide a smart or intelligent power module.

The power control semiconductor chip 300a and/or the low power semiconductor chip 300b can include connection pads 300ap and 300bp on their top surfaces, respectively. In this case, the connection pads 300ap and 300bp can be electrically connected to the interconnection patterns 200 using wires 400. The interconnection patterns 200 can be connected to an external circuit through a plurality of leads 500 of the high power semiconductor package 1000.

After a wiring process, the high power semiconductor package 1000 may be encapsulated by the encapsulation member 600 such as an epoxy molding compound (EMC) through a transfer molding process. The encapsulation member 600 encapsulates the insulation substrate 100, the interconnection patterns 200, and the semiconductor chips 300a and 300b, while the encapsulation member 600 may expose a second surface 100b of the insulation substrate 100.

In the transfer molding process, the encapsulation member 600 can fill in the first dimples 200D. Thereafter, the encapsulation member 600 may be hardened through a well-known hardening process, thereby completing the formation of the high power semiconductor package 1000.

Since the second surface 100b of the insulation substrate 100 is not covered by the encapsulation member 600 in the transfer molding process, heat can be dissipated from the high power semiconductor package 1000 more efficiently. A heat sink (not shown) can be attached to the exposed second surface 100b of the insulation substrate 100. However, the contact area between the encapsulation member 600 and the insulation substrate 100 is reduced since the second surface 100b of the insulation substrate 100 is exposed. Thus, a bond between the encapsulation member 600 and the insulation substrate 100 can be weakened, and mechanical characteristics of the high power semiconductor package 1000 can deteriorate. Furthermore, the moisture resistance of the high power semiconductor package 1000 can deteriorate since moisture can permeate through an interface between the encapsulation member 600 and the exposed second surface 100b of the insulation substrate 100.

However, according to an embodiment of the present invention, the contact area between the encapsulation member 600 and the insulation substrate 100 including the interconnection patterns 200 can be increased since the encapsulation member 600 is filled in the first dimples 200D, thereby compensating for the reduction in bonding strength between the encapsulation member 600 and the insulation substrate 100 caused by the exposed second surface 100b of the insulation substrate 100. Furthermore, in other embodiment of the present invention, more first dimples 200D can be formed in the interconnection patterns 200 located on the edge portion of the insulation substrate 100 than in the interconnection patterns 200 located on the center portion of the insulation substrate 100. Therefore, the resistance to the permeation passage of moisture provided through the interface between an encapsulation member 600 and the insulation substrate 100 can be increased and, thus, the moisture resistance of the high power semiconductor package 2000 can be improved.

Figure 2A:
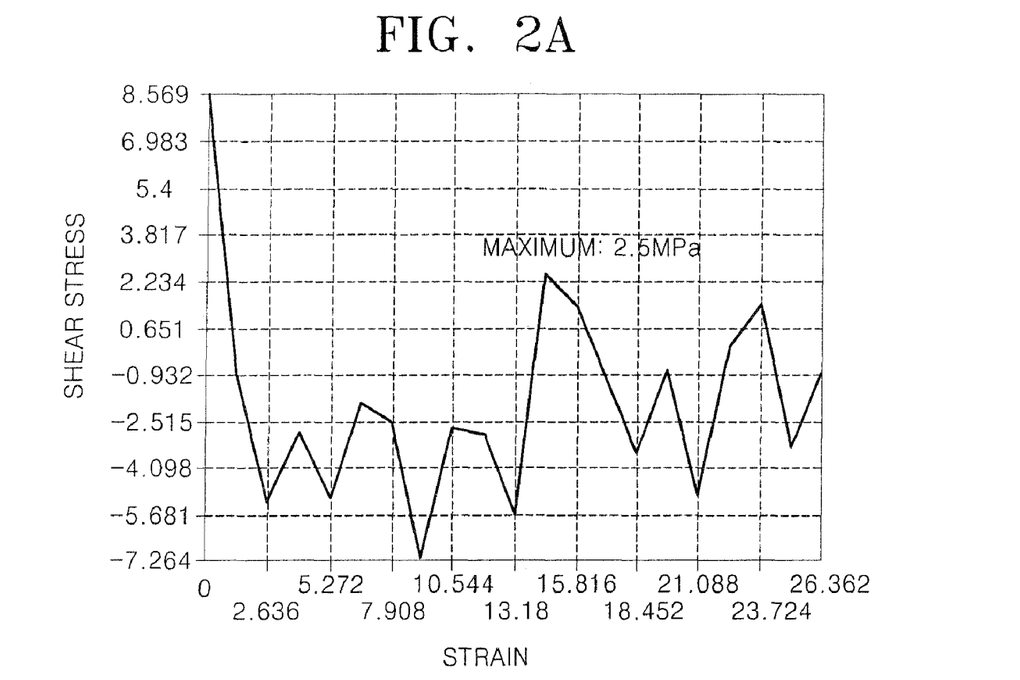
FIG. 2A is a stress-strain graph illustrating a shear stress evaluation result of a high power semiconductor package including first dimples according to an embodiment of the present invention.
Figure 2B:
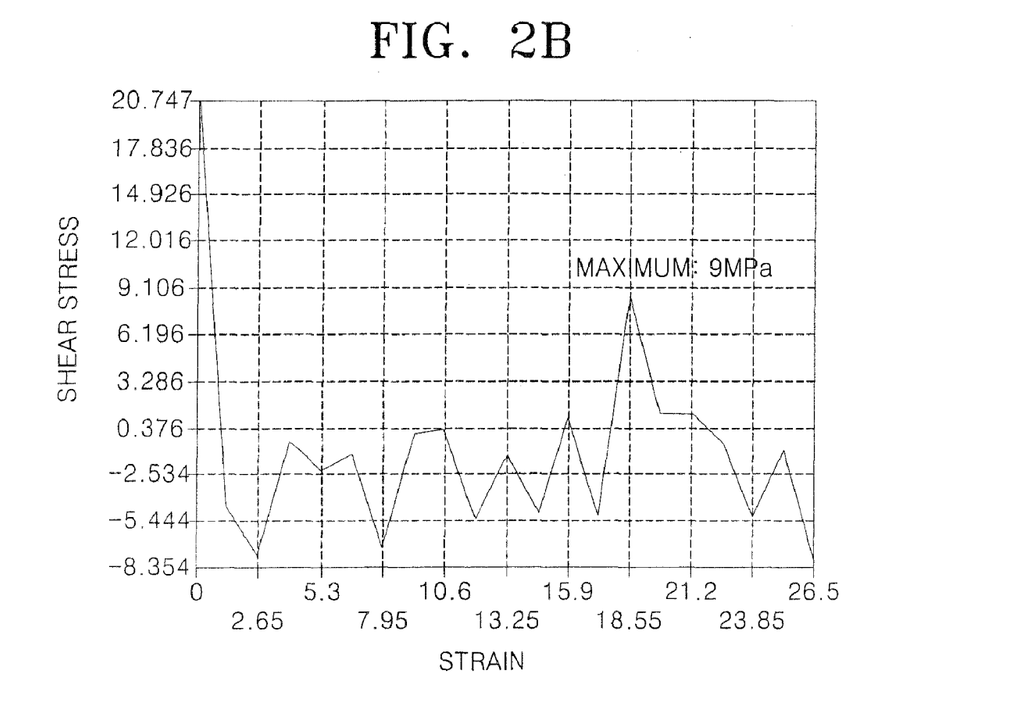
FIG. 2B is a stress-strain graph illustrating a shear stress evaluation result of a conventional high power semiconductor package not including first dimples.

FIG. 2A is a stress-strain graph illustrating a shear stress evaluation result of a high power semiconductor package with first dimples according to an embodiment of the present invention, and FIG. 2B is a stress-strain graph illustrating a shear stress evaluation result of a conventional high power semiconductor package without first dimples. A commercial simulation tool was used. Both of the evaluated high power semiconductor packages have interconnection patterns with the same shape illustrated in FIG. 1B. In the simulations, the coefficient of thermal expansion (CTE) of the interconnection patterns was set to that of copper (17 ppm/° C.), the CTE of the insulation substrate was set to that of $Al_2O_3$ (7 ppm/° C.), and the CTE of the encapsulation member was set to that of an EMC (9 ppm/° C.), in order to evaluate the effect of the dimples in the case where the dimples are applied to a DBC substrate that is widely used owing to its good electrical and heat-dissipation characteristics.

In FIGS. 2A and 2B, the horizontal axes denote shear strain and the vertical axes denote shear stress. It can be understood that relatively low shear stress is applied to the interconnection patterns with the first dimples as compared with the interconnection patterns without the first dimples. The maximum shear stress was 9 MPa in the case of the interconnection patterns without the first dimples; however, the maximum shear stress was 2.5 MPa in the case of the interconnection patterns with the first dimples. According to an embodiment of the present invention, the shear stress acting on the interface between the interconnection patterns and the insulation substrate can be reduced by about 72% by forming the first dimple in the interconnection patterns.

Figure 3:
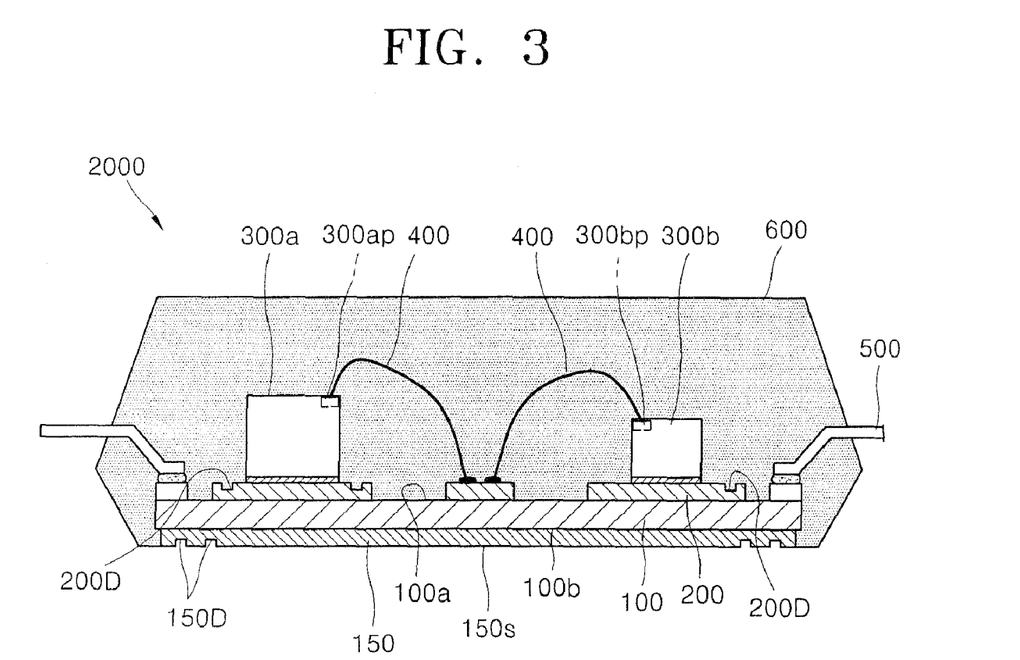
FIG. 3 is a cross-sectional view illustrating a high power semiconductor package according to another embodiment of the present invention.
Figure 4:
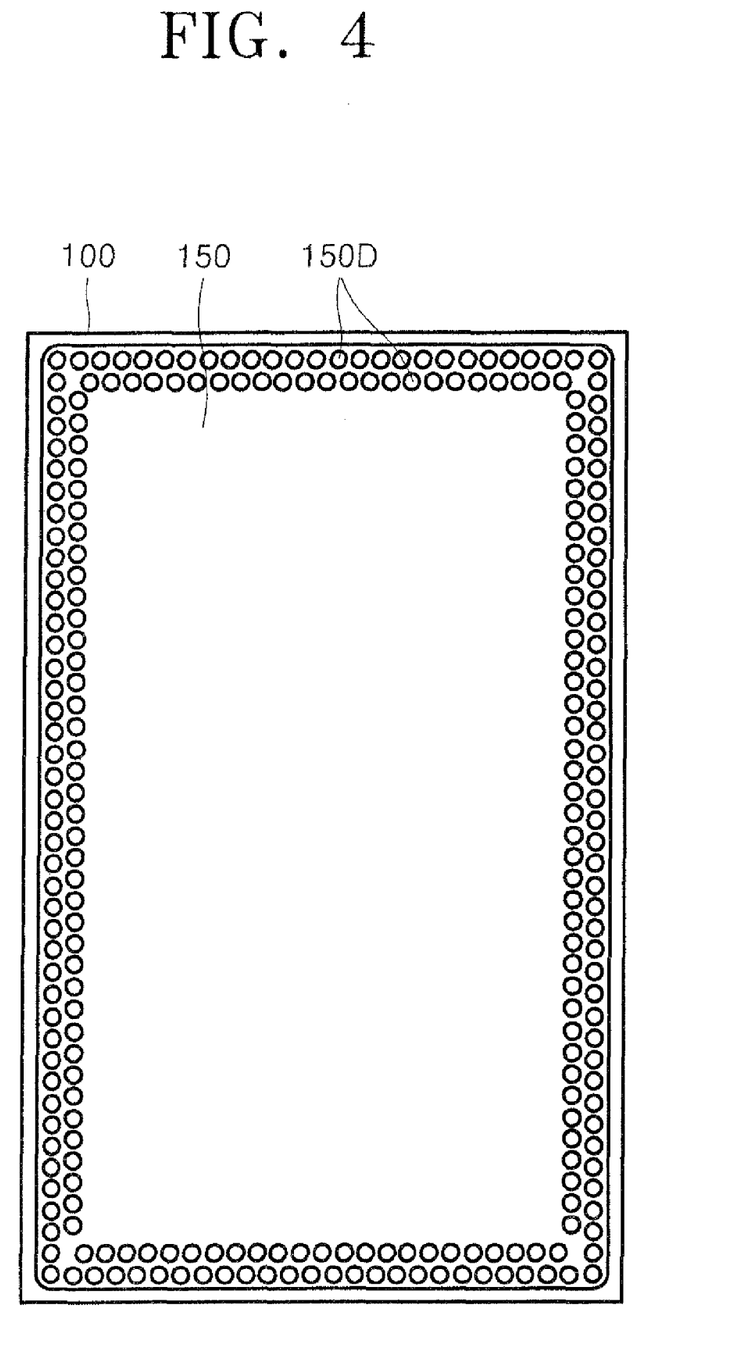
FIG. 4 is a bottom plan view illustrating a base metal layer of the high power semiconductor package of FIG. 3, according to an embodiment of the present invention.

FIG. 3 is a cross-sectional view illustrating a high power semiconductor package 2000 according to another embodiment of the present invention, and FIG. 4 is a bottom plan view illustrating a base metal layer 150 of the high power semiconductor package 2000 of FIG. 3, according to an embodiment of the present invention.

Referring to FIGS. 3 and 4, interconnection patterns 200 including first dimples 200D can be formed on a first surface 100a of an insulation substrate 100. As described in FIGS. 1A and 1B, the first dimples 200D are formed in the interconnection patterns 200 located on the edge portion of the insulation substrate 100 more densely than in the interconnection patterns 200 located on the center portion of the insulation substrate 100. Therefore, the resistance to the permeation passage of moisture provided through the interface between an encapsulation member 600 and the insulation substrate 100 can be increased and, thus, the moisture resistance of the high power semiconductor package 2000 can be improved.

A base metal layer 150 can be additionally formed on a second surface 100b of the insulation substrate 100 to increase heat dissipation ability of the high power semiconductor package 2000. The base metal layer 150 can be formed of copper, a copper alloy, aluminum, or an aluminum alloy. In some embodiments of the present invention, the encapsulation member 600 may encapsulate the insulation substrate 100, the interconnection patterns 200, semiconductor chips 300a and 300b, and wires 400 except for a bottom surface of the base metal layer 150. A heat sink (not shown) can be attached to the exposed bottom surface of the base metal layer 150.

Second dimples 150D can be formed in edges of the base metal layer 150. For example, the second dimples 150D can be formed by wet etching, as described above about the first dimples 200D. The second dimples 150D can range in depth from 10% to 100% of the thickness of the base metal layer 150. During a transfer molding process, the encapsulation member 600 may permeate into the second dimples 150D to fill the second dimples 150D.

According to the embodiments of the present invention, where the second dimples 150D are formed in the base metal layer 150, the deformation of the edge portion of the base metal layer 150 due to the heat expansion can be reduced, thereby reducing a shear stress acting on the interface between the base metal layer 150 and the insulation substrate 100 due to a difference in thermal expansion coefficients between the base metal layer 150 and the insulation substrate 100. Since the shear stress acting between the base metal layer 150 and the insulation substrate 100 is reduced, the high power semiconductor package 2000 can be reliably used without a mechanical defect caused by the repetition of thermal cycles.

In the high power semiconductor package of the present invention, the interconnection patterns is formed with the first dimples in order to reduce the shear stress caused by the difference in the thermal expansion coefficients of the interconnection patterns, the insulation substrate, and the encapsulation member. Therefore, the electrical and mechanical characteristics of the high power semiconductor package can be maintained even after thermal cycles are repeated.

Furthermore, according to the present invention, the encapsulation member is filled in the first dimples to increase the contact area between the encapsulation member and the insulation substrate including the interconnection patterns so that a reduction in bonding strength between the encapsulation member and the insulation substrate caused by the exposed second surface of the insulation substrate can be compensated. In addition, the first dimples filled with the encapsulation member reduces the possibility of permeation of moisture through the interface between the encapsulation member and the exposed second surface of the insulation substrate, thereby improving the moisture resistance of the high power semiconductor package.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high power semiconductor package comprising:
an insulation substrate having first and second surfaces opposite to each other;
interconnection patterns formed on the first surface of the insulation substrate, the interconnection patterns including a plurality of first dimples, the plurality of first dimples being separated from each other at predetermined intervals and the plurality of first dimples not being connected between each other and terminating above the second surface of the insulation substrate, and being indentations of the interconnection patterns, said dimples reducing a thermal induced shear stress acting on the interface between the interconnection patterns and the insulation substrate;
a power control semiconductor chip mounted on one of the interconnection patterns the power control semiconductor chip electrically connected with the interconnection patterns; and
an encapsulation member encapsulating the insulation substrate, the interconnection patterns, and the power control semiconductor chip and exposing at least a portion of the second surface of the insulation substrate.

2. The high power semiconductor package of claim 1, wherein the insulation substrate is a ceramic substrate.

3. The high power semiconductor package of claim 2, wherein the ceramic substrate is formed of $Al_2O_3$ or BeO.

4. The high power semiconductor package of claim 1, wherein the insulation substrate is formed of a metal nitride.

5. The high power semiconductor package of claim 4, wherein the metal nitride is AlN or SiN.

6. The high power semiconductor package of claim 4, wherein the interconnection patterns is formed of copper or a copper alloy.

7. The high power semiconductor package of claim 1, wherein the interconnection patterns has a thickness in a range from 100 μm to 500 μm.

8. The high power semiconductor package of claim 1, wherein the encapsulation member is formed of an epoxy molding compound (EMC).

9. The high power semiconductor package of claim 1, wherein the first dimples are formed in an edge portion of the interconnection patterns.

10. The high power semiconductor package of claim 1, wherein the first dimples have a maximum diameter in a range from 0.1 mm to 3 mm.

11. The high power semiconductor package of claim 1, wherein the first dimples range in depth from 10% to 100% of a thickness of the interconnection patterns.

12. The high power semiconductor package of claim 1, wherein the first dimples are arranged at regular intervals in at least one row.

13. The high power semiconductor package of claim 1, wherein the encapsulation member fills up the first dimples.

14. The high power semiconductor package of claim 1, further comprising a low power semiconductor chip mounted on, and electrically connected with, one of the interconnection patterns, so as to drive the power control semiconductor chip.

15. The high power semiconductor package of claim 1, wherein the first dimples are formed in the interconnection patterns located on the edge portion of the insulation substrate more densely than in the interconnection patterns located on the center portion of the insulation substrate.

16. The high power semiconductor package of claim 1, wherein the interconnection patterns is formed of copper or a copper alloy.

17. The high power semiconductor package of claim 1, further including a base metal layer formed on the second surface of the insulation substrate.

18. The high power semiconductor package of claim 17, further comprising a plurality of second dimples formed in an edge of the bottom surface of the base metal layer.

19. The high power semiconductor package of claim 1, wherein the first dimples have a depth that is less than a thickness of the interconnection patterns.

20. The high power semiconductor package of claim 1, wherein a bottom surface of the power control semiconductor chip is bonded to one of the interconnection patterns by soldering or an adhesive.

21. The high power semiconductor package of claim 1, wherein the interconnection patterns include at least a first and second interconnection pattern, each of which has a shape different than the other, the first and second interconnection patterns defining first and second die attach areas, respectively.

22. The high power semiconductor package of claim 21, further including a first semiconductor die mounted on the first die attach area of the first interconnection pattern and a second semiconductor die mounted on the second die attach area of the second interconnection pattern.

23. The high power semiconductor package of claim 22, further including a third interconnection pattern electrically connected to the first and second semiconductor dies.

24. The high power semiconductor package of claim 1, wherein each dimple in the plurality of first dimples has a boundary that does not intersect the boundary of any other dimple in the plurality of first dimples.

25. The high power semiconductor package of claim 1, wherein the power control semiconductor chip mounted is on one of the interconnection patterns such that it is positioned between two dimples that are on the same interconnection pattern.

26. The high power semiconductor package of claim 1, further comprising a base metal layer formed on the second surface of the insulation substrate and a plurality of second dimples formed in the base metal layer.

27. A high power semiconductor package comprising:
an insulation substrate having first and second surfaces opposite to each other,
interconnection patterns formed on the first surface of the insulation substrate, the interconnection patterns including a plurality of first dimples, the plurality of first dimples being separated from each other at predetermined intervals and the plurality of first dimples not being connected between each other and terminating above the second surface of the insulation substrate, and being indentations of the interconnection patterns;
a power control semiconductor chip mounted on one of the interconnection patterns, the power control semiconductor chip electrically connected with the interconnection patterns;

a base metal layer formed on the second surface of the insulation substrate; and an encapsulation member encapsulating the insulation substrate, the interconnection patterns, and the power control semiconductor chip and exposing at least a portion of a bottom surface of the base metal layer.

28. The high power semiconductor package of claim 27, wherein the insulation substrate is a ceramic substrate.

29. The high power semiconductor package of claim 27, wherein the insulation substrate is formed of a metal nitride.

30. The high power semiconductor package of claim 27, wherein the interconnection patterns is formed of copper or a copper alloy.

31. The high power semiconductor package of claim 27, wherein the interconnection patterns has a thickness in a range from 100 μm to 500 μm.

32. The high power semiconductor package of claim 27, wherein the base metal layer is formed of aluminum, an aluminum alloy, copper, or a copper alloy.

33. The high power semiconductor package of claim 27, wherein the first dimples are formed in an edge portion of the interconnection patterns.

34. The high power semiconductor package of claim 27, wherein the first dimples have a maximum diameter in a range from 0.1 mm to 3 mm.

35. The high power semiconductor package of claim 27, wherein the first dimples range in depth from 10% to 100% of a thickness of the interconnection patterns.

36. The high power semiconductor package of claim 27, further comprising a plurality of second dimples formed in an edge of the bottom surface of the base metal layer.

37. The high power semiconductor package of claim 36, wherein the second dimples have a diameter in a range from 0.1 mm to 3 mm.

38. The high power semiconductor package of claim 36, wherein the second dimples range in depth from 10% to 100% of a thickness of the base metal layer.

39. The high power semiconductor package of claim 36, wherein the second dimples are arranged at regular intervals in at least one row.

40. The high power semiconductor package of claim 36, wherein the encapsulation member fills up the first dimples.

41. The high power semiconductor package of claim 27, further comprising a low power semiconductor chip mounted on the first surface of the insulation substrate, the low power semiconductor chip electrically connected with the interconnection patterns so as to drive the power control semiconductor chip.

42. The high power semiconductor package of claim 27, wherein the first dimples are formed in the interconnection patterns located on the edge portion of the insulation substrate more densely than in the interconnection patterns located on the center portion of the insulation substrate.

43. The high power semiconductor package of claim 27, wherein a bottom surface of the power control semiconductor chip is bonded to one of the interconnection patterns by soldering or an adhesive.

\* \* \* \* \*